United States Patent
Jonely (10) Patent No.: US 9,806,551 B2
(45) Date of Patent: Oct. 31, 2017

(54) CIRCUITS AND METHODS FOR USING PARALLEL SEPARATE BATTERY CELLS

(71) Applicant: Master Lock Company LLC, Oak Creek, WI (US)

(72) Inventor: Michael B. Jonely, Whitewater, WI (US)

(73) Assignee: Master Lock Company LLC, Oak Creek, WI (US)

( * ) Notice: Subject to any disclaimer, the term of this patent is extended or adjusted under 35 U.S.C. 154(b) by 205 days.

(21) Appl. No.: 14/834,556

(22) Filed: Aug. 25, 2015

(65) Prior Publication Data

US 2016/0056656 A1 Feb. 25, 2016

Related U.S. Application Data

(60) Provisional application No. 62/041,198, filed on Aug. 25, 2014.

(51) Int. Cl.
| H01M 10/46 | (2006.01) |
| H02J 7/00 | (2006.01) |
| H02J 1/10 | (2006.01) |
| H03K 17/30 | (2006.01) |
| H03K 17/693 | (2006.01) |
| H02J 7/34 | (2006.01) |

(52) U.S. Cl.
CPC .............. *H02J 7/0063* (2013.01); *H02J 1/10* (2013.01); *H02J 1/108* (2013.01); *H03K 17/302* (2013.01); *H03K 17/693* (2013.01); *H02J 7/34* (2013.01)

(58) Field of Classification Search
CPC .......................... H02J 7/0063; H02J 2007/0067
USPC ..... 320/107, 112, 114, 115, 135; 307/43, 48
See application file for complete search history.

(56) References Cited

U.S. PATENT DOCUMENTS

| 5,568,038 A | 10/1996 | Tatsumi |
| 5,686,814 A | 11/1997 | Wierzbicki |
| 6,586,909 B1 | 7/2003 | Trepka |
| 6,888,337 B2 | 5/2005 | Sawyers |
| 7,379,282 B1 | 5/2008 | Zansky |
| 8,294,295 B2 | 10/2012 | Xiao |
| 8,436,583 B2 | 5/2013 | Guang et al. |
| 2002/0039034 A1 | 4/2002 | Kohda |
| 2002/0044465 A1 | 4/2002 | Tsai |
| 2002/0113494 A1 | 8/2002 | Winick |
| 2002/0125992 A1 | 9/2002 | Harwood |
| 2003/0184934 A1 | 10/2003 | Bushue |
| 2004/0095021 A1 | 5/2004 | Fogleman |
| 2012/0068817 A1 | 3/2012 | Fisher |

(Continued)

FOREIGN PATENT DOCUMENTS

| DE | 3834867 C1 | 1/1990 |
| EP | 1863176 A1 | 12/2007 |

(Continued)

OTHER PUBLICATIONS

International Search Report and Written Opinion from International Application No. PCT/US2015/046652 dated Nov. 3, 2015.

*Primary Examiner* — Edward Tso
(74) *Attorney, Agent, or Firm* — Calfee, Halter & Griswold, LLP (57) ABSTRACT

Circuits and methods allowing virtually any number of batteries to be connected in parallel without the supply voltage being substantially reduced, while allowing their capacities to add directly as well as increasing the current capability of the batteries by placing the batteries' internal resistances in parallel.

18 Claims, 4 Drawing Sheets

Exemplary embodiment (56) References Cited

U.S. PATENT DOCUMENTS

2013/0241499 A1  9/2013  Johnson et al.
2013/0278220 A1  10/2013  Cao et al.
2013/0285598 A1  10/2013  Guang et al.

FOREIGN PATENT DOCUMENTS

| JP | H03 243119 A | 10/1991 |
| WO | 2009070506 | 6/2009 |
| WO | 2011160628 | 12/2011 |

Figure 1: PRIOR ART - Series diodes prevent one battery from charging the other.

Figure 2: Exemplary embodiment

Figure 3: Exemplary control circuits for controlling active circuit elements.

Figure 4: Exemplary circuit implementation of a battery paralleling circuit.

Figure 5: Battery pack with battery paralleling circuit.

Figure 6: Battery and battery paralleling circuit powering other circutry.

CIRCUITS AND METHODS FOR USING PARALLEL SEPARATE BATTERY CELLS

CROSS-REFERENCE TO RELATED APPLICATION

This application claims the benefit of U.S. Provisional Patent Application Ser. No. 62/041,198, entitled "CIRCUITS AND METHODS USING PARALLEL, SEPARATE BATTERY CELLS" and filed Aug. 25, 2014, the entire contents of which are incorporated herein by reference, to the extent that they are not conflicting with the present application.

BACKGROUND

Primary batteries are batteries designed to be used once and discarded. Secondary batteries are rechargeable and typically can be used over many charge-discharge cycles. In many circuits a plurality of primary or secondary batteries are used. Some circuits are designed to use a plurality of separate battery cells (primary cells or secondary cells) connected in series to provide a higher voltage collectively than a single cell provides. Other circuits are designed to be used with a plurality of separate battery cells (primary cells or secondary cells) connected in parallel to provide a higher current and capacity (e.g., mAh) collectively than a single cell can deliver.

In typical series configurations, the plurality of separate battery cells can simply be connected in series circuit communication without additional circuitry. Typical parallel battery designs do not connect the plurality of separate battery cells in parallel without additional circuitry because at least one battery will be a drain on the other. More specifically, in theory, when batteries are placed in parallel, the capacities of each cell add because a fraction of the current that goes to the device comes from each cell. In the experience of the Applicant, however, when batteries are placed in parallel, their capacities do not add. On paper the math works, but in practice the capacities of each cell are actually reduced. Because the cells in parallel are not perfectly balanced, in two-cell parallel circuits, the stronger cell will charge the weaker cell. Hysteresis effects of the battery's terminal voltage allow the cell being charged to now become the stronger of the two, and the once weaker cell will start to charge the cell that was doing the charging earlier. This back and forth process typically continues until the two batteries have prematurely completely discharged each other.

Figure 1:
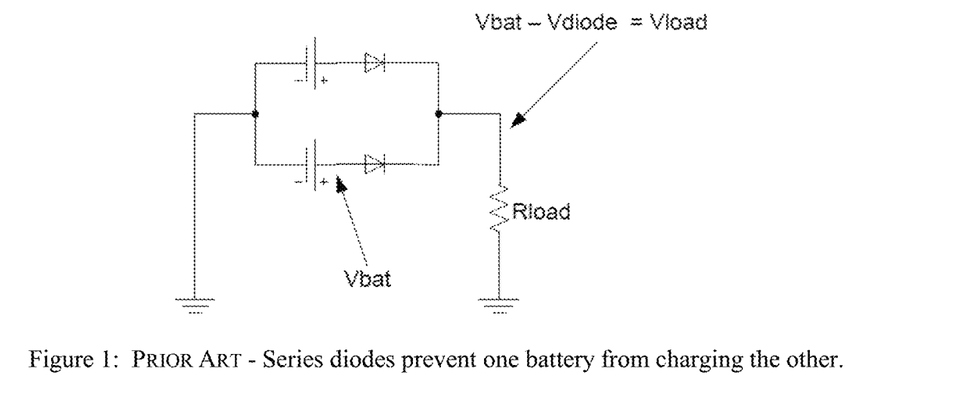
FIG. 1 shows a prior art circuit with parallel battery cells and passive diodes.

What is typically done to prevent parallel batteries from charging each other is to put diodes in series with the batteries and the series battery/diode combinations are connected in parallel, as shown in FIG. 1. The configuration of FIG. 1 works for many applications, but not when the battery cell voltage is near the operating voltage of the load. This is because the forward voltage drop of the diodes is substantial, e.g., about 0.6 volts for standard rectifier diodes, and around 0.3 volts for Schottky diodes. This voltage drop is too high for some circuits, and the electronics will not work properly because the lower limit of operating voltage has been reached or exceeded.

Lithium primary cells serve as an example. Many variations of primary lithium chemistry cells exist, but nearly all of the batteries have a terminal voltage close to 3 volts. This is convenient because most modern circuitry is designed to operate with a 3 volt supply. The CR123A battery is readily available and relatively inexpensive and has a useable capacity near 1100 mAh. However, this capacity is much less than even a small alkaline battery such as the AA battery, which typically has a capacity of about 2500 mAh. Alkaline batteries do not provide the performance required over an extended temperature range that is required in an industrial or commercial application, especially cold temperatures. The CR123A lithium manganese dioxide cell offers high pulse current capability over an extended temperature range. With the lower capacity, it would be helpful to be able to couple a plurality of lithium cells in parallel; however, using diodes is unacceptable because the 0.3 to 0.6 volt voltage drop is too high, and the 3 volt electronics will not work properly because the lower limit of operating voltage has been exceeded.

SUMMARY

The present application discloses circuits and methods allowing virtually any number of batteries to be connected in parallel without the supply voltage being substantially reduced, while allowing their capacities to add directly as well as increasing the current capability of the batteries by placing the batteries' internal resistances in parallel.

An exemplary circuit provides electrical power to a load from parallel batteries and comprises: a first battery cell having a first cell voltage and providing electrical power to the load via a first active element; a second battery cell having a second cell voltage and providing electrical power to the load via a second active element; a first control circuit in circuit communication with the load and with the first active element and actively controlling the first active element to prevent the second battery cell from charging the first battery cell; and a second control circuit in circuit communication with the load and with the second active element and actively controlling the second active element to prevent the first battery cell from charging the second battery cell.

Another exemplary circuit provides electrical power to a load from parallel batteries and comprises: at least two or three or four or five battery cells, each battery cell having a corresponding cell voltage and providing electrical power to the load via a corresponding active element; and each battery cell having a corresponding control circuit in circuit communication with the load and with the corresponding active element and actively controlling the corresponding active element to prevent the corresponding battery cell from being charged by the battery cells.

An exemplary method of providing electrical power to a load from parallel batteries, comprises: providing electrical power to the load via a first active element from a first battery cell having a first cell voltage; actively controlling the first active element to prevent the second battery cell from charging the first battery cell; providing electrical power to the load via a second active element from a second battery cell having a second cell voltage; and actively controlling the second active element to prevent the first battery cell from charging the second battery cell.

DETAILED DESCRIPTION

This Detailed Description merely describes exemplary embodiments of the invention and is not intended to limit the scope of the claims in any way. Indeed, the invention as claimed is broader than and unlimited by the preferred embodiments, and the terms used in the claims have their full ordinary meaning.

The present application discloses circuits and methods allowing virtually any number of batteries to be connected in parallel without the supply voltage being substantially reduced, while allowing their capacities to add directly as well as increasing the current capability of the batteries by placing the batteries' internal resistances in parallel.

Figure 2:
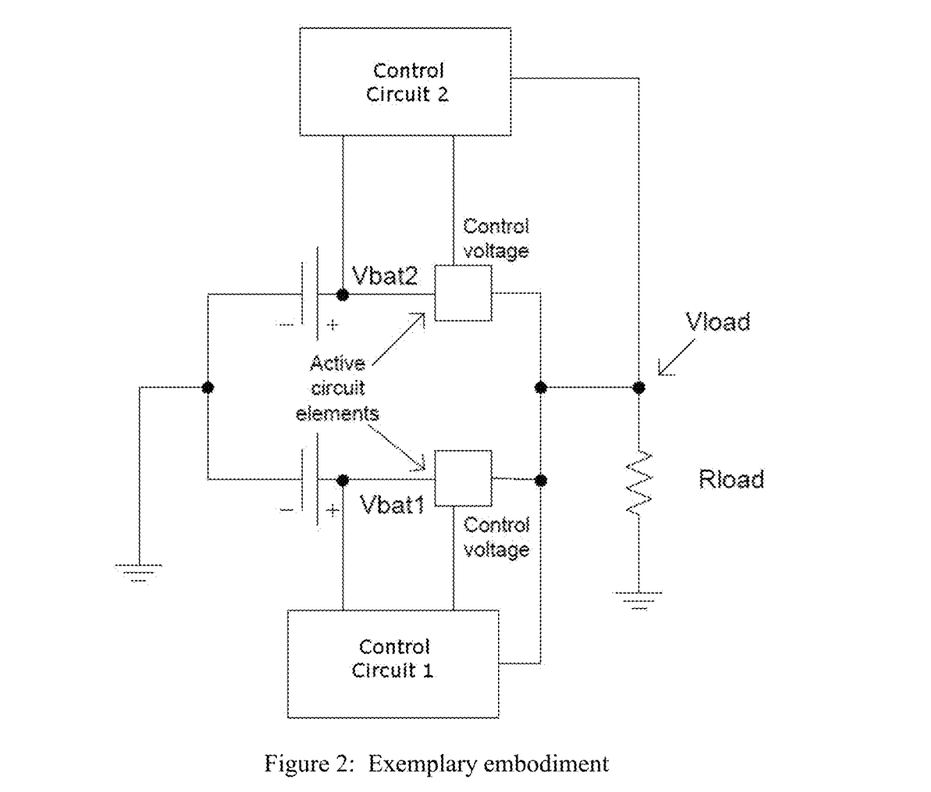
FIG. 2 is a schematic circuit diagram of an exemplary circuit according to the present application.

Referring now to FIG. 2, a schematic circuit diagram is shown of an exemplary embodiment 10 with two batteries BAT1 and BAT2 powering a load represented by resistance $R_{load}$ and having a load voltage $V_{load}$. The batteries BAT1 and BAT2 are connected in parallel and have associated battery voltages $V_{BAT1}$ and $V_{BAT2}$, respectively. Each battery BAT1 and BAT2 has an associated active circuit element 12, 14 in series circuit relationship. The active circuit element 12 of battery BAT1 is actively controlled by a first control circuit 16. Similarly, active circuit element 14 of battery BAT2 is actively controlled by a second control circuit 18. First cell BAT1 provides electrical power to the load through the first active element 12. Similarly, second cell BAT2 provides electrical power to the load through the second active element 14. First control circuit actively controls the first active element 12 with control voltage 1 to prevent the second cell BAT2 from charging the first cell BAT1. Similarly, the second control circuit actively controls the second active element 14 with control voltage 2 to prevent the first cell BAT1 from charging the second cell BAT2. The first and second control circuits in this exemplary embodiment accept as inputs at least the load voltage (i.e., is directly or indirectly connected to the load or a load connector, discussed below) and their respective battery voltage and generate their respective control voltage. In exemplary embodiments, the first and second control circuits 16, 18 actively control their respective active element to maintain a positive voltage difference between their respective cell voltage and the load voltage to prevent the other cell from charging their respective cell. In exemplary embodiments, the first and second control circuits 16, 18 actively control their respective active element to maintain a positive voltage difference above a respective threshold between their respective cell voltage and the load voltage to prevent the other cell from charging their respective cell. The active circuit elements 12, 14 can be, for example, field-effect transistors (FETs), such as metal-oxide-semiconductor FETs (MOSFETs), and other devices with a controllable resistance, e.g., a voltage-controllable resistance. In theory, a bipolar PNP transistor or a PNP darlington couple could be used, but typical devices would result in an increased voltage drop. A MOSFET can give a low, <0.1 volt drop.

In exemplary embodiments, the first and second control circuits 16, 18 are implemented with analog circuits such as discrete analog components or an analog application specific integrated circuit (ASIC). In other exemplary embodiments, the first and second control circuits are implemented with digital logic for performing the various functions and processes described herein. Combinations of analog and digital circuits can also be used. "Logic," synonymous with "circuit" as used herein includes, but is not limited to, hardware, firmware, software and/or combinations of each to perform one or more functions or actions. For example, based on a desired application or needs, logic may include a software controlled processor, discrete logic such as a digital ASIC, programmed logic device, or other processor. Logic may also be fully embodied as software. "Software," as used herein, includes but is not limited to one or more computer readable and/or executable instructions that cause a processor or other electronic device to perform functions, actions, processes, and/or behave in a desired manner. The instructions may be embodied in various forms such as routines, algorithms, modules or programs including separate applications or code from dynamically linked libraries (DLLs). Software may also be implemented in various forms such as a stand-alone program, a web-based program, a function call, a subroutine, a servlet, an application, an app, an applet, a plug-in, instructions stored in a memory, part of an operating system, or other type of executable instructions or interpreted instructions from which executable instructions are created. It will be appreciated by one of ordinary skill in the art that the form of software is dependent on, for example, requirements of a desired application, the environment it runs on, and/or the desires of a designer/programmer or the like.

Figure 3:
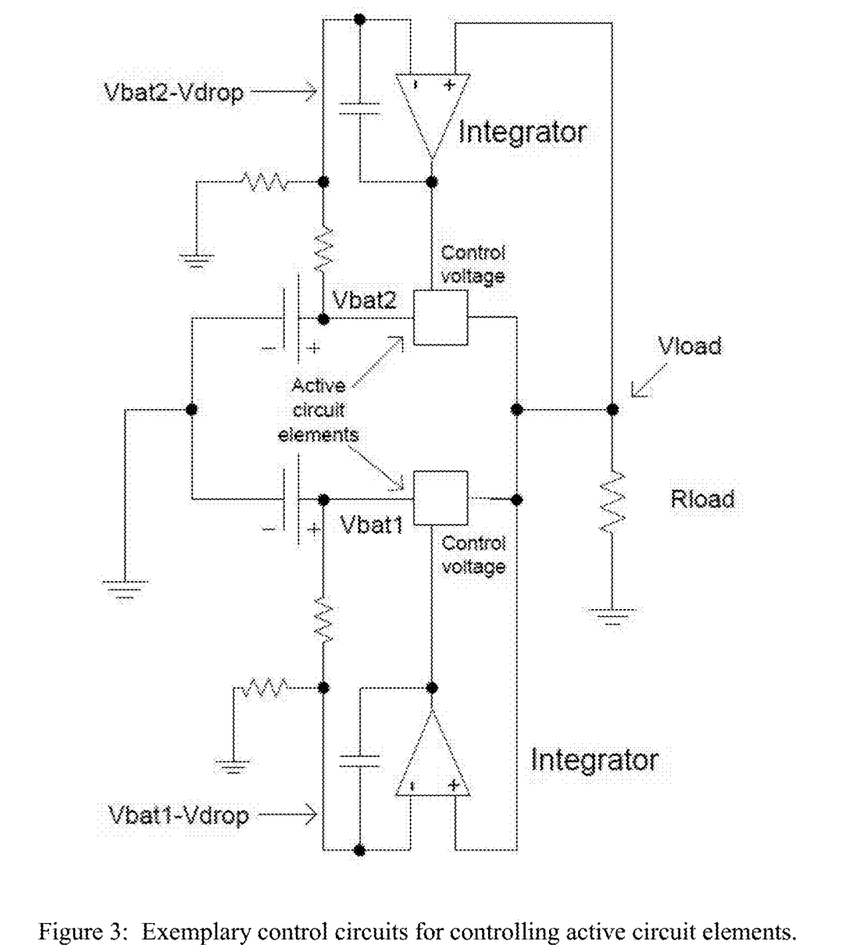
FIG. 3 is a schematic circuit diagram of another exemplary circuit according to the present application.

Referring now to FIG. 3, a medium-level schematic diagram is shown of an exemplary circuit 20 with an exemplary embodiment of the first and second control circuits 16, 18 in the context of FIG. 2. Exemplary circuit 20 of FIG. 3 is the same as circuit 10 shown in FIG. 2 and described above except the first and second control circuits 16, 18 are implemented with analog integrators. More specifically, first and second control circuits 16, 18 are implemented with respective operational amplifiers (op amps) 22, 24, a capacitor 26, 28, and a resistor voltage divider 30, 32. Like first and second control circuits 16, 18 of FIG. 2, first and second control circuits 16, 18 in the exemplary embodiment of FIG. 3 accept as inputs at least the load voltage and their respective battery voltage and generate their respective control voltage. Like first and second control circuits 16, 18 of FIG. 2, first and second control circuits 16, 18 in FIG. 3 actively control their respective active element to maintain a positive voltage difference between their respective cell voltage and the load voltage to prevent the other cell from charging their respective cell, e.g., maintain a positive voltage difference above a respective threshold between their respective cell voltage and the load voltage to prevent the other cell from charging their respective cell.

In the exemplary circuit of FIG. 3, the op amps 22, 24 are configured as integrators that are used to derive the control voltages. One input voltage for each integrator is the battery voltage, minus a small voltage offset $V_{drop}$, e.g., 10-50 mV or 20-40 mV or about 30 mV or so, which is determined by the voltage dividers 30, 32, as discussed below. It is expected that circuits will use a lower Vdrop such as those mentioned immediately above; however, in theory, other $V_{drop}$ values can be used and still end up with a circuit that works better than the 0.3-0.7 Volt drop associated with the circuit of FIG. 1, e.g., in the range of 10-100 mV or 10-200 mV, depending on the operating voltage of the load. Those skilled in the art can determine the resistors needed based on this specification and the drawings. The other reference voltage for the integrators is the voltage at the load $V_{load}$. The op amp integrators will change their respective output to make their two inputs equal. Therefore a control voltage is maintained that results in a voltage difference between the battery voltage and the load voltage of $V_{drop}$. Therefore, a constant forward voltage drop is maintained, similar to the diode in FIG. 1, except the voltage drop is much less. Thus, the battery cannot be charged, because this would require a negative $V_{drop}$. If a negative $V_{drop}$ occurs, the integrator output rails high and the resistance of the active circuit element 12, 14 is at a maximum.

Figure 4:
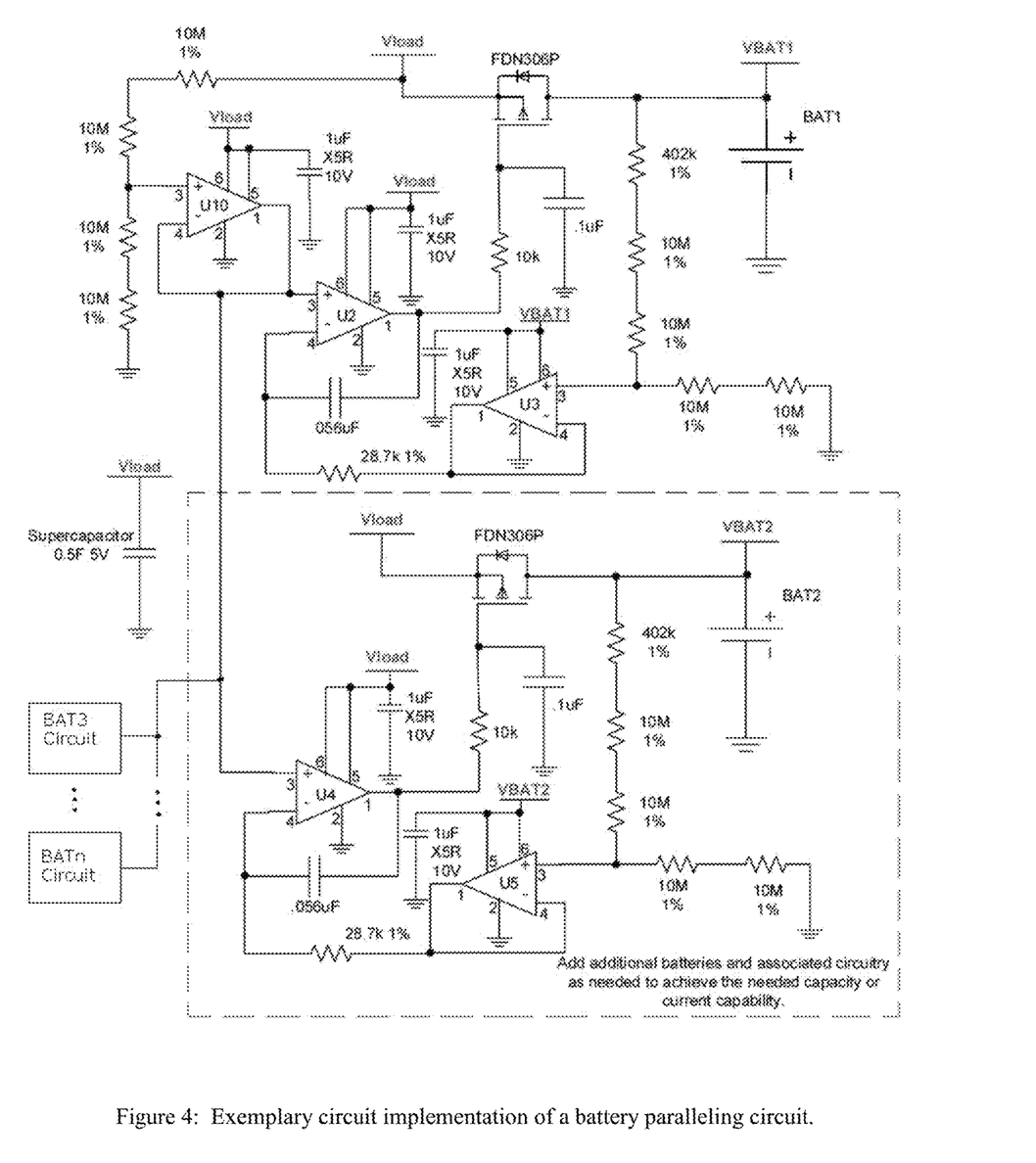
FIG. 4 is a schematic circuit diagram of an exemplary circuit implementation according to the present application.

FIG. 4 is a schematic circuit diagram of an exemplary implementation of the circuit of FIG. 3. The exemplary circuit 50 of FIG. 4 has a Vdrop of about 30 mV and can be used to connect in parallel two, three, or more CR123A lithium 3-Volt primary cells, thus outputting a $V_{load}$ of about 2.97 Volts and combining the current and capacity of the plurality of cells. Comparing FIG. 4 with FIG. 3, integrator op amp 22 for BAT1 in FIG. 3 is implemented using op amp U2 in FIG. 4 (with its corresponding capacitor and resistor). Similarly, integrator op amp 24 for BAT2 in FIG. 3 is implemented using op amp U4 in FIG. 4 (with its corresponding capacitor and resistor). Active elements 12, 14 in FIG. 3 are implemented by FDN306P p-channel MOSFETs (one for each battery) in FIG. 4. Voltage dividers 30, 32 in FIG. 3 are implemented by voltage dividers 52, 54, 56 and op amps U3, U5, U10 in a voltage follower configuration in FIG. 4. Notice that voltage dividers 52, 54 are the same and voltage divider 56 differs by not having the extra 402 kΩ resistor in series, like voltage dividers 52, 54 do. The circuit of FIG. 4 is shown with two batteries BAT1 and BAT2. The voltage drop across the FETs is constant and is set by the voltage difference between the Vsupply voltage reference set up by the voltage divider 54 and op amp U10 on $V_{load}$, and the voltage set up by the voltage divider 52, 54, and the buffer U3, U5 on each cell. The integrator works so that it will adjust its output to make the difference between its inputs zero. The output of the integrator is connected to the gate of the FET. So it will apply whatever voltage to the gate of the FET that will zero out the different voltages on its inputs. So the ~30 mV in the FIG. 4 circuit is the difference in voltage between the two references (with a 3 volt battery voltage). The $V_{load}$ reference is provided by a voltage divider 54 with 20 MΩ on the top leg and the bottom leg (reference voltage=1.5). The voltage reference developed from each battery is provided by a voltage divider 50, 52, having 20 MΩ on the top leg and the bottom leg, but also has the additional 402 kΩ resistor in the top leg. So its resulting voltage is lower by 15 mV (i.e., 1.485V) than the reference voltage output by divider 54. The integrator changes the voltage on the gate of the MOSFET so that the battery voltage remains higher than VLOAD by the 30 mV at 3V resulting in an output of 2.97 volts from the battery via the FET. Using 1% resistors permits a 30 mV $V_{drop}$ in a production circuit. The 30 mV drop can be reduced by changing the 402 kΩ resistor in the top leg to a smaller value; however, because of resistor tolerance stack up, one would likely use resistors with a tighter tolerance, e.g., 0.1% resistors, to implement a lower $V_{drop}$ in production (1% of 20 MΩ is 200 kΩ).

To add additional batteries in parallel to the circuit of FIG. 4, the components of block 60 would be repeated (as shown schematically by blocks 62 and 64) and connected to $V_{load}$ and the reference voltage output by U10. In exemplary systems, the circuit 50 is implemented on a printed circuit board (PCB) and the batteries are held in suitable electrically conductive clips and connected to the circuit 50 via conductive traces on the PCB and/or wires.

In the exemplary schematic of FIG. 4, the control circuits continuously change the gate voltage depending on the current flow through the MOSFETs. When low currents are drawn from $V_{load}$, the on resistance of the MOSFET is quite high, so the gate voltage will be higher; the MOSFET is more "turned off" by the control circuit. When a high current pulse is needed, the gate voltage is decreased rapidly to decrease the on resistance of the MOSFET, to maintain the 30 mV drop. This doesn't happen instantaneously due to the low bandwidth of the low current op amps used. The 0.5 Farad super capacitor shown in FIG. 4 helps ensure that if a high current pulse is drawn by the load, that the supply will maintain its voltage. In general, higher current loads will require a lower gate voltage to turn the MOSFET on harder to decrease its resistance and lessen the voltage drop. The MOSFET resistance can be calculated with ohms law, because we know the voltage and the current. If one battery dies before the others, its gate voltage will rail high and the MOSFET will be turned off, because the integrator cannot maintain zero volts difference between its inputs.

In the exemplary embodiment of FIG. 4, the capacities of CR123A batteries are, for the most part, summed. More specifically, a single CR123A battery has a capacity of about 1100 mAh. Two CR123A batteries in the circuit of FIG. 4 have a collective capacity of about 2200 mAh. Three CR123A batteries in the circuit of FIG. 4 have a collective capacity of about 3300 mAh. Similarly, in the exemplary embodiment of FIG. 4, the useable currents of CR123A batteries are, for the most part, summed. Also, from measured data, when using more batteries in parallel, each cell can be more completely discharged before it completely dies. Therefore for a given application, maybe only 900 mAh can be used from a single cell. When two cells are used, maybe 1000 mAh can be used from each cell. Three cells may be able to provide 1100 mAh each, four may provide 1200 mAh each. This is due to reduced current drain from any one cell when multiple cells are used, for a given application.

Figure 5:
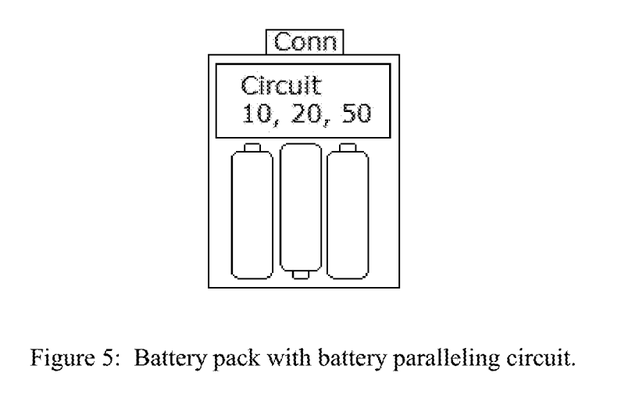
FIG. 5 is a schematic diagram showing a plurality of batteries and battery paralleling circuitry in a separate battery pack.
Figure 6:
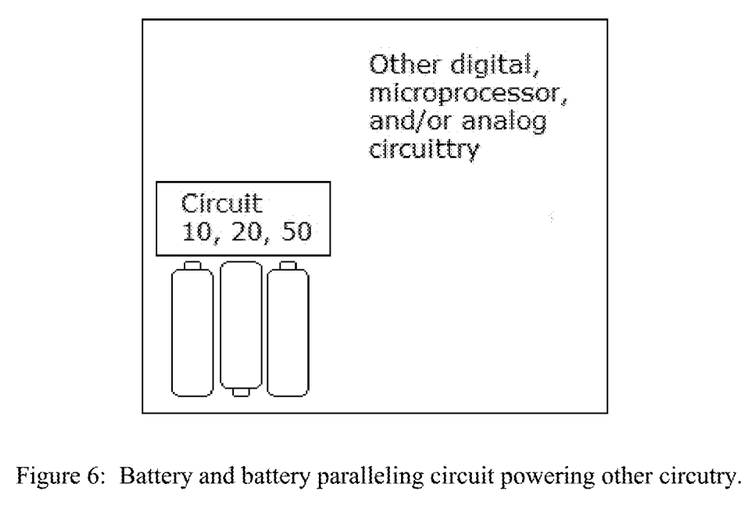
FIG. 6 is a schematic diagram showing a plurality of batteries and battery paralleling circuitry along with other circuitry being powered by the batteries and the battery paralleling circuit.

In exemplary embodiments, as shown in FIG. 5, the batteries and battery paralleling circuit 10, 20, or 50 are packaged together as a battery pack 70 in an enclosure 72 with connectors (e.g., a $V_{load}$ connector and a ground connector) for connecting to circuitry (not shown), to circuitry external to the enclosure and powered by the batteries via the battery paralleling circuit 10, 20, or 50. The enclosure 72 and connectors can have a standard form factor, such as a specific battery size and connector arrangement. In exemplary embodiments, the $V_{load}$ and ground connectors are conductive regions, such as the terminals of a standard AA battery or CR123A battery. In other exemplary embodiments, the $V_{load}$ and ground connectors are connectors that provide physical and electrical connections to the external circuit, e.g., connectors having pins that mate with corresponding connectors. In exemplary embodiments, the enclosure 72 is sealed so the batteries cannot be readily changed. In other exemplary embodiments, the enclosure 72 can be opened so the batteries can be changed. As shown in FIG. 6, in other exemplary embodiments, the batteries and battery paralleling circuit 10, 20, or 50 are integrated into a PCB containing other circuitry 80 powered by the batteries via the battery paralleling circuit 10, 20, or 50.

As described herein, when one or more components are described as being connected, joined, affixed, coupled, attached, or otherwise interconnected, such interconnection may be direct as between the components or may be indirect such as through the use of one or more intermediary components. Also as described herein, reference to a "member," "component," or "portion" shall not be limited to a single structural member, component, or element but can include an assembly of components, members or elements.

While the present invention has been illustrated by the description of embodiments thereof, and while the embodiments have been described in considerable detail, it is not the intention of the applicant to restrict or in any way limit the scope of the invention to such details. In general, although it is expected that most implementations will use primary battery cells, there is no reason the teachings herein cannot be applied to secondary (rechargeable) cells, so long as the battery-driven circuit is not expected to charge the batteries unless or until an additional power source is connected. Additional advantages and modifications will readily appear to those skilled in the art. For example, although the active elements are shown downstream with respect to the batteries (from a current flow standpoint), they could be positioned upstream from the batteries. Additionally, the steps of all processes and methods herein can be performed in any order, unless two or more steps are expressly stated as being performed in a particular order, or certain steps inherently require a particular order. Therefore, the inventive concept, in its broader aspects, is not limited to the specific details, the representative apparatus, and illustrative examples shown and described. Accordingly, departures may be made from such details without departing from the spirit or scope of the applicant's general inventive concept.

I claim:

1. A circuit providing electrical power to a load from parallel batteries, comprising:
    a first battery cell having a first cell voltage and providing electrical power to the load via a first active element;
    a second battery cell having a second cell voltage and providing electrical power to the load via a second active element;
    a first control circuit electrically connected to the load and with the first active element and actively controlling the first active element to prevent the second battery cell from charging the first battery cell; and
    a second control circuit electrically connected to the load and with the second active element and actively controlling the second active element to prevent the first battery cell from charging the second battery cell; and
    wherein the first control circuit actively controls the first active element to increase the resistance of the first active element to prevent the second battery cell from charging the first battery cell; and
    wherein the second control circuit actively controls the second active element to increase the resistance of the second active element to prevent the first battery cell from charging the second battery cell; and
    further comprising a load voltage divider providing a load reference voltage from a load voltage; and
    each control circuit having a corresponding cell voltage divider providing a corresponding cell reference voltage from a corresponding cell voltage, the cell voltage divider providing as the cell reference voltage a smaller percentage of the corresponding cell voltage than the percentage of the load voltage provided by the load voltage divider as the load reference voltage; and
    each control circuit controlling the corresponding active element based on the difference between the load reference voltage and the corresponding cell reference voltage to prevent the corresponding battery cell from being charged by the other battery cells.

2. The circuit providing electrical power to a load from parallel batteries according to claim 1, wherein:
    the first control circuit actively controls the first active element to maintain a positive voltage difference between the first cell voltage and the load voltage to prevent the second battery cell from charging the first battery cell; and
    the second control circuit actively controls the second active element to maintain a positive voltage difference between the second cell voltage and the load voltage to prevent the first battery cell from charging the second battery cell.

3. The circuit providing electrical power to a load from parallel batteries according to claim 1, wherein:
    the first control circuit actively controls the first active element to maintain a positive voltage difference above a first threshold between the first cell voltage and the load voltage to prevent the second battery cell from charging the first battery cell; and
    the second control circuit actively controls the second active element to maintain a positive voltage difference above a second threshold between the second cell voltage and the load voltage to prevent the first battery cell from charging the second battery cell.

4. The circuit providing electrical power to a load from parallel batteries according to claim 1:
    further comprising a third battery cell having a third cell voltage and providing electrical power to the load via a third active element; and
    further comprising a third control circuit in electrically connected to the load and with the third active element and actively controlling the third active element to prevent the first and second battery cells from charging the third battery cell; and
    wherein the first control circuit actively controls the first active element to prevent the second and third battery cells from charging the first battery cell; and
    wherein the second control circuit actively controls the second active element to prevent the first and third battery cells from charging the second battery cell.

5. The circuit providing electrical power to a load from parallel batteries according to claim 4, wherein:
    the first control circuit actively controls the first active element to maintain a positive voltage difference between the first cell voltage and the load voltage to prevent the second and third battery cells from charging the first battery cell; and
    the second control circuit actively controls the second active element to maintain a positive voltage difference between the second cell voltage and the load voltage to prevent the first and third battery cells from charging the second battery cell; and
    wherein the third control circuit actively controls the third active element to maintain a positive voltage difference between the third cell voltage and the load voltage to prevent the first and second battery cells from charging the third battery cell.

6. The circuit providing electrical power to a load from parallel batteries according to claim 4, wherein:
    the first control circuit actively controls the first active element to maintain a positive voltage difference above a first threshold between the first cell voltage and the load voltage to prevent the second and third battery cells from charging the first battery cell; and the second control circuit actively controls the second active element to maintain a positive voltage difference above a second threshold between the second cell voltage and the load voltage to prevent the first and third battery cells from charging the second battery cell; and wherein the third control circuit actively controls the third active element to maintain a positive voltage difference above a third threshold between the third cell voltage and the load voltage to prevent the first and second battery cells from charging the third battery cell.

7. The circuit providing electrical power to a load from parallel batteries according to claim 4, wherein:

the first control circuit actively controls the first active element to increase the resistance of the first active element to prevent the second and third battery cells from charging the first battery cell; and the second control circuit actively controls the second active element to increase the resistance of the second active element to prevent the first and third battery cells from charging the second battery cell; and wherein the third control circuit actively controls the third active element to increase the resistance of the third active element to prevent the first and second battery cells from charging the third battery cell.

8. The circuit providing electrical power to a load from parallel batteries according to claim 1, wherein the battery cells each have a voltage that is 0.01-0.29 volts higher than the operating voltage of the load.

9. The circuit providing electrical power to a load from parallel batteries according to claim 1, wherein the battery cells and circuitry are packaged in an enclosure and form a battery pack, wherein the enclosure has a load connector, and wherein the instances of load in the foregoing refer to the load connector.

10. A method of providing electrical power to a load from parallel batteries, comprising:

providing electrical power to the load via a first active element from a first battery cell having a first cell voltage;

actively controlling the first active element to prevent the second battery cell from charging the first battery cell;

providing electrical power to the load via a second active element from a second battery cell having a second cell voltage; and actively controlling the second active element to prevent the first battery cell from charging the second battery cell; and further comprising:

actively controlling the first active element to increase the resistance of the first active element to prevent the second battery cell from charging the first battery cell; and actively controlling the second active element to increase the resistance of the second active element to prevent the first battery cell from charging the second battery cell; and providing a load reference voltage from a load voltage, and for each cell, providing a corresponding cell reference voltage from a corresponding cell voltage, the cell voltage divider providing as the cell reference voltage a smaller percentage of the corresponding cell voltage than the percentage of the load voltage provided by the load voltage divider as the load reference voltage, and controlling the corresponding active element based on the difference between the load reference voltage and the corresponding cell reference voltage to prevent the corresponding battery cell from being charged by the other battery cells.

11. The method of providing electrical power to a load from parallel batteries according to claim 10, further comprising:

actively controlling the first active element to maintain a positive voltage difference between the first cell voltage and the load voltage to prevent the second battery cell from charging the first battery cell; and actively controlling the second active element to maintain a positive voltage difference between the second cell voltage and the load voltage to prevent the first battery cell from charging the second battery cell.

12. The method of providing electrical power to a load from parallel batteries according to claim 10, further comprising:

actively controlling the first active element to maintain a positive voltage difference above a first threshold between the first cell voltage and the load voltage to prevent the second battery cell from charging the first battery cell; and actively controlling the second active element to maintain a positive voltage difference above a second threshold between the second cell voltage and the load voltage to prevent the first battery cell from charging the second battery cell.

13. The method of providing electrical power to a load from parallel batteries according to claim 10 further comprising:

a third battery cell having a third cell voltage; and providing electrical power to the load via a third active element; and actively controlling the third active element to prevent the first and second battery cells from charging the third battery cell; and actively controlling the first active element to prevent the second and third battery cells from charging the first battery cell; and actively controlling the second active element to prevent the first and third battery cells from charging the second battery cell.

14. The method of providing electrical power to a load from parallel batteries according to claim 13, further comprising:

actively controlling the first active element to maintain a positive voltage difference between the first cell voltage and the load voltage to prevent the second and third battery cells from charging the first battery cell; and actively controlling the second active element to maintain a positive voltage difference between the second cell voltage and the load voltage to prevent the first and third battery cells from charging the second battery cell; and actively controlling the third active element to maintain a positive voltage difference between the third cell voltage and the load voltage to prevent the first and second battery cells from charging the third battery cell.

15. The method of providing electrical power to a load from parallel batteries according to claim 13, further comprising:

actively controlling the first active element to maintain a positive voltage difference above a first threshold between the first cell voltage and the load voltage to prevent the second and third battery cells from charging the first battery cell; and actively controlling the second active element to maintain a positive voltage difference above a second threshold between the second cell voltage and the load voltage to prevent the first and third battery cells from charging the second battery cell; and actively controlling the third active element to maintain a positive voltage difference above a third threshold between the third cell voltage and the load voltage to prevent the first and second battery cells from charging the third battery cell.

16. The method of providing electrical power to a load from parallel batteries according to claim 13, further comprising:

actively controlling the first active element to increase the resistance of the first active element to prevent the second and third battery cells from charging the first battery cell; and actively controlling the second active element to increase the resistance of the second active element to prevent the first and third battery cells from charging the second battery cell; and actively controlling the third active element to increase the resistance of the third active element to prevent the first and second battery cells from charging the third battery cell.

17. The method of providing electrical power to a load from parallel batteries according to claim 10, wherein the battery cells each have a voltage that is 0.01-0.29 volts higher than the operating voltage of the load.

18. The method of providing electrical power to a load from parallel batteries according to claim 10, wherein the battery cells and circuitry are packaged in an enclosure and form a battery pack, wherein the enclosure has a load connector, and wherein the instances of load in the foregoing refer to the load connector.

* * * * *